(12) United States Patent
Kim et al.

(10) Patent No.: US 8,350,250 B2
(45) Date of Patent: Jan. 8, 2013

(54) NITRIDE-BASED LIGHT EMITTING DEVICE

(75) Inventors: Jong Wook Kim, Seoul (KR); Bong Koo Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 58 days.

(21) Appl. No.: 11/878,641

(22) Filed: Jul. 25, 2007

(65) Prior Publication Data

US 2008/0023689 A1    Jan. 31, 2008

(30) Foreign Application Priority Data

Jul. 26, 2006  (KR) .................. 10-2006-0070214

(51) Int. Cl.
*H01L 29/06* (2006.01)
(52) U.S. Cl. ............. 257/13; 257/85; 257/94; 257/96; 257/97; 257/101; 257/102; 257/E33.008
(58) Field of Classification Search .............. 257/85, 257/94, 96, 97, 101, 102, 13, E33.008
See application file for complete search history.

(56) References Cited

U.S. PATENT DOCUMENTS

| | | | |
|---|---|---|---|
| 6,436,784 B1 * | 8/2002 | Allam | 438/380 |
| 6,664,560 B2 * | 12/2003 | Emerson et al. | 257/14 |
| 6,803,597 B2 * | 10/2004 | Watatani et al. | 257/15 |
| 2003/0043875 A1 * | 3/2003 | Gen-Ei et al. | 372/46 |
| 2003/0118066 A1 * | 6/2003 | Bour et al. | 372/45 |
| 2005/0087753 A1 * | 4/2005 | D'Evelyn et al. | 257/98 |
| 2005/0116216 A1 | 6/2005 | Harle et al. | |
| 2006/0054902 A1 * | 3/2006 | Johnson | 257/84 |
| 2006/0086932 A1 * | 4/2006 | Kim et al. | 257/13 |
| 2007/0102693 A1 * | 5/2007 | Nagai | 257/13 |

FOREIGN PATENT DOCUMENTS

| | | |
|---|---|---|
| JP | 61194790 | 8/1986 |
| JP | 63152194 | 6/1988 |
| JP | 02-228087 | 9/1990 |
| JP | 08-220496 | 8/1996 |
| JP | 10145004 | 5/1998 |
| JP | 10223983 | 8/1998 |
| JP | 10242512 | 9/1998 |
| JP | 2000-196201 | 7/2000 |
| JP | 2003-060225 | 2/2003 |
| JP | 2003-204122 | 7/2003 |
| JP | 2003-318495 | 11/2003 |
| JP | 2004-179428 | 6/2004 |
| JP | 2007-059913 | 3/2007 |
| KR | 10-2006-0066872 | 6/2006 |
| WO | WO 02/097904 | 12/2002 |

\* cited by examiner

*Primary Examiner* — Ken Parker
*Assistant Examiner* — Dale E Page
(74) *Attorney, Agent, or Firm* — McKenna Long & Aldridge LLP

(57) ABSTRACT

A nitride-based light emitting device capable of achieving an enhancement in light emission efficiency and an enhancement in reliability is disclosed. The nitride-based light emitting device includes a first-conductivity semiconductor layer, a second-conductivity semiconductor layer, an active layer arranged between the first-conductivity semiconductor layer and the second-conductivity semiconductor layer, the active layer including at least one pair of a quantum well layer and a quantum barrier layer, a plurality of first layers arranged on at least one of an interface between the first-conductivity semiconductor layer and the active layer and an interface between the second-conductivity semiconductor layer and the active layer, the first layers having different energy band gaps or different thicknesses, and second layers each interposed between adjacent ones of the first layers, the second layers exhibiting an energy band gap higher than the energy band gaps of the first layers.

20 Claims, 8 Drawing Sheets

US 8,350,250 B2

NITRIDE-BASED LIGHT EMITTING DEVICE

This application claims the benefit of Korean Patent Application No. 10-2006-0070214, filed on Jul. 26, 2006, which is hereby incorporated by reference as if fully set forth herein.

BACKGROUND OF THE INVENTION

1. Field of the Invention

The present invention relates to a nitride-based light emitting device, and more particularly to a nitride-based light emitting device capable of achieving an enhancement in light emission efficiency and an enhancement in reliability.

2. Discussion of the Related Art

Light emitting diodes (LEDs) are well known as a semiconductor light emitting device which converts current to light, to emit light. Since a red LED using GaAsP compound semiconductors was made commercially available in 1962, it has been used, together with a GaP:N-based green LED, as a light source in electronic apparatuses, for image display.

The wavelength of light emitted from such an LED depends on the semiconductor material used to fabricate the LED. This is because the wavelength of the emitted light depends on the band-gap of the semiconductor material representing energy difference between valence-band electrons and conduction-band electrons.

A gallium nitride (GaN) compound semiconductor has been highlighted in the field of high-power electronic devices including light emitting diodes (LEDs) because it exhibits a high thermal stability and a wide band-gap of 0.8 to 6.2 eV. One of the reasons why the GaN compound semiconductor has been highlighted is that it is possible to fabricate semiconductor layers capable of emitting green, blue, and white light, using GaN in combination with other elements, for example, indium (In), aluminum (Al), etc.

Thus, it is possible to adjust the wavelength of light to be emitted, in accordance with the characteristics of a specific apparatus, using GaN in combination with other appropriate elements. For example, it is possible to fabricate a blue LED useful for optical recording or a white LED capable of replacing a glow lamp.

By virtue of the above-mentioned advantages of the GaN-based material, techniques associated with GaN-based electro-optic devices have rapidly developed since the GaN-based LEDs became commercially available in 1994.

The brightness or output of an LED manufactured using the above-mentioned GaN-based material mainly depends on the structure of an active layer, the extraction efficiency associated with external extraction of light, the size of the LED chip, the kind and angle of a mold used to assemble a lamp package, the fluorescent material used, etc.

Meanwhile, the reason why it is difficult to grow such a GaN-based semiconductor, as compared to other III-V ground compound semiconductors is that, for example, there is no high-quality substrate such as a wafer made of GaN, InN, AlN, or the like.

For this reason, although the LED structure is grown over a substrate made of a material different from that of the above-mentioned substrate, for example, sapphire, a large amount of defects are generated in this case. Such defects have severe influence on the performance of the LED.

The basic structure of an LED made of such a GaN-based material is illustrated in FIG. 1. As shown in FIG. 1, the basic LED structure includes an n-type semiconductor layer 1, an active layer 2 arranged adjacent to the n-type semiconductor layer 1, and a p-type semiconductor layer 3 arranged adjacent to the active layer 2. The active layer 2 has a quantum well structure. FIG. 2 illustrates an energy band structure of the above-mentioned LED structure.

FIG. 1 illustrates a state in which the LED structure is grown over a substrate 4. Practically, the LED structure is formed over a buffer layer 5 arranged on the substrate 4.

After the growth of the LED structure, an electrode (not shown) is formed, to enable the LED structure to emit light in accordance with injection of charges into the LED structure through the electrode.

SUMMARY OF THE INVENTION

Accordingly, the present invention is directed to a nitride-based light emitting device that substantially obviates one or more problems due to limitations and disadvantages of the related art.

An object of the present invention is to provide a nitride-based light emitting device capable of adjusting or suppressing the generation of strain and crystal defects while efficiently confining electrons and holes in an active layer, thereby achieving an enhancement in reliability.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a nitride-based light emitting device comprises: a first-conductivity semiconductor layer; a second-conductivity semiconductor layer; an active layer arranged between the first-conductivity semiconductor layer and the second-conductivity semiconductor layer, the active layer including at least one pair of a quantum well layer and a quantum barrier layer; a plurality of first layers arranged on at least one of an interface between the first-conductivity semiconductor layer and the active layer and an interface between the second-conductivity semiconductor layer and the active layer, the first layers having different energy band gaps or different thicknesses; and second layers each interposed between adjacent ones of the first layers, the second layers exhibiting an energy band gap higher than the energy band gaps of the first layers.

In another aspect of the present invention, a nitride-based light emitting device comprises: a conductive semiconductor layer; a first active layer arranged on the conductive semiconductor layer, the first active layer including a quantum barrier layer and quantum well layer; and a second active layer interposed between the conductive semiconductor layer and the first active layer, the second active layer including a plurality of quantum well layers having different energy band gaps or different thicknesses.

In still another aspect of the present invention, a nitride-based light emitting device comprises: a first-conductivity semiconductor layer connected to a first electrode; a second-conductivity semiconductor layer connected to a second electrode; an active layer arranged between the first-conductivity semiconductor layer and the second-conductivity semiconductor layer; a plurality of first layers arranged on at least one of interfaces among the first-conductivity semiconductor layer, the second-conductivity semiconductor layer, and the active layer, the first layers exhibiting an energy band gap higher than an energy band gap of the first-conductivity semiconductor layer or an energy band gap of the second-conductivity semiconductor layer; and second layers each interposed between adjacent ones of the first layers, the second layers exhibiting an energy band gap higher than the energy band gap of the first layers.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
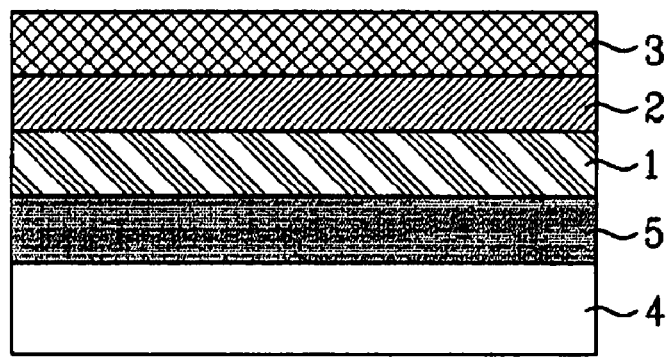
FIG. 1 is a sectional view illustrating an example of general light emitting device.
Figure 2:
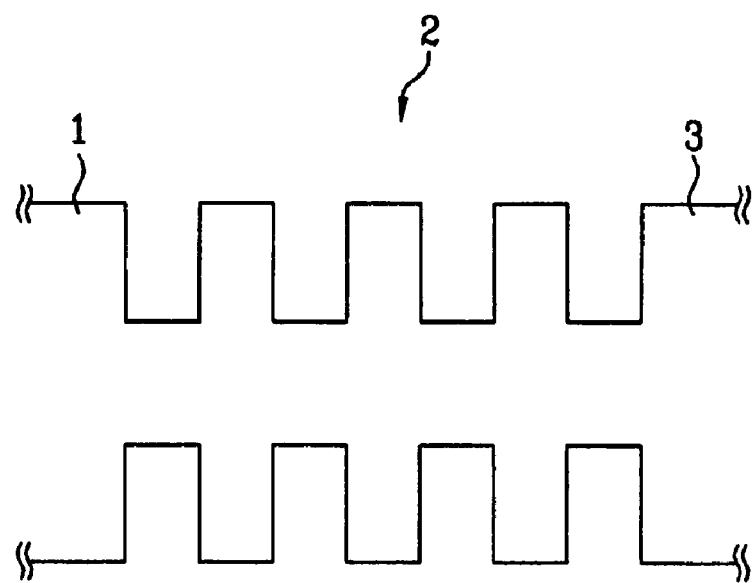
FIG. 2 is an energy band diagram of the case shown in FIG. 1.

The present invention now will be described more fully hereinafter with reference to the accompanying figures, in which embodiments of the invention are shown.

This invention may, however, be embodied in many alternate forms and should not be construed as limited to the embodiments set forth herein. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

It will be understood that when an element such as a layer, region or substrate is referred to as being "on" another element, it can be directly on the other element or intervening elements may also be present. It will also be understood that if part of an element, such as a surface, is referred to as "inner," it is farther to the outside of the device than other parts of the element.

In addition, relative terms, such as "beneath" and "overlies", may be used herein to describe one layer's or region's relationship to another layer or region as illustrated in the figures.

It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms.

These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

First Embodiment

Figure 3:
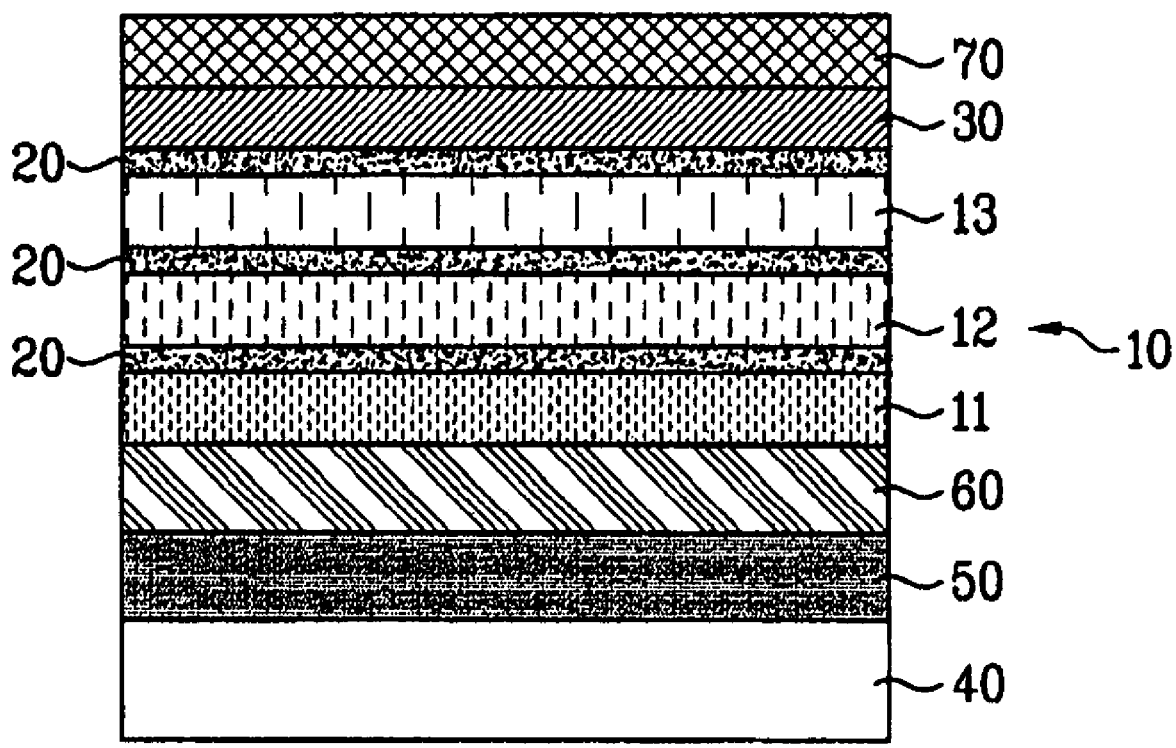
FIG. 3 is a sectional view illustrating a first embodiment of the present invention.

FIG. 3 illustrates a structure according to a first embodiment of the present invention. This structure includes first layers 10 respectively made of different InGaN materials having different In contents. In the illustrated case, the first layers 10 comprise layers 11, 12, and 13. The structure also includes second layers 20 each interposed between adjacent ones of the first layers 10 and made of GaN, and an active layer 30 arranged over the uppermost one of the second layers 20.

The above-described structure may be formed such that the first and second layers 10 and 20 are alternately arranged over an n-type semiconductor layer 60 formed on a substrate 40. An undoped buffer layer 50 may be interposed between the substrate 40 and the n-type semiconductor layer 60.

The active layer 30, which is arranged above the first and second layers 10 and 20, may have a quantum well structure including a quantum well layer and a quantum barrier layer. A p-type semiconductor layer 70 may be formed over the active layer 30.

The first layers 10 have different In contents such that an upper one of the first layers 10 has an In content larger than that of a lower one of the first layers 10. That is, the second InGaN layer 12 has an In content larger than the In content of the first InGaN layer 11, and the third InGaN layer 13 has an In content larger than the In content of the second InGaN layer 12.

Accordingly, a nearer one of the first layers 10 to the active layer 30 has an In content more approximate to the In content of the active layer 30. In this case, the In content of the nearer first layer 10 may be smaller than that of the active layer 30.

Figure 4:
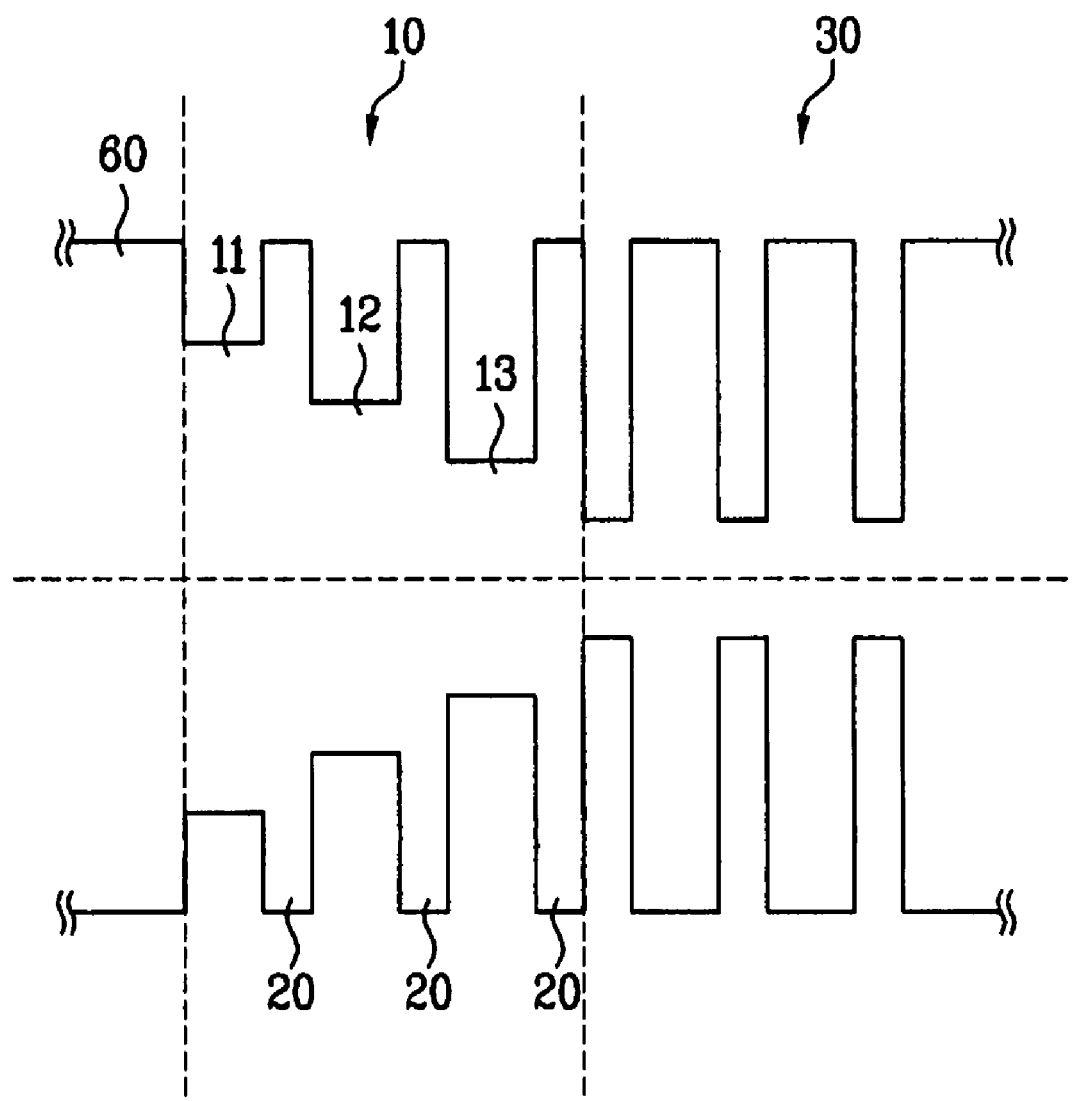
FIG. 4 is an energy band diagram of the case shown in FIG. 3.

In this case, the first layer 10 having a larger In content exhibits a lower energy band gap than that of the first layer 10 having a smaller In content, while further approximating to that of the active layer 30, as shown in FIG. 4.

When an InGaN material is grown to form the active layer 30, it is subjected to reduced strain or stress as compared to the case, in which the active layer 30 is grown directly over the n-type semiconductor layer 60, in accordance with the above-described structure. Accordingly, a high-quality InGaN quantum well layer is grown for the active layer 30.

As shown in FIG. 4, the band gaps of the first layers 10 are approximate to that of the active layer 30 as they are approximate to the active layer 30. Accordingly, carriers are captured by the first layers arranged beneath the active layer 30, namely, the three InGaN layers 11, 12, and 13, so that they can be efficiently injected into the InGaN quantum well layer of the active layer 30.

The second layers 20, each interposed between the adjacent ones of the InGaN layers 11, 12, and 13, may have a thickness smaller than that of the InGaN layers 11, 12, and 13.

Accordingly, the second layers 20 do not interfere with a flow of carriers.

Where the active layer 30 and first layers 10 are made of InGaN, and the first layers 10 have a composition expressed by $In_xGa_{1-x}N$, it is preferred that "x" be 0.1 to 0.15 ($0.1 \leq x \leq 0.15$).

Meanwhile, where the active layer 30 is made of InGaN, the first layers 10 may be made of AlInGaN, as long as the contents of Al and In can be appropriately controlled.

It is also preferred that the thickness of the first layers 10 be 50 to 1,000 Å, and the thickness of the second layers 20 be 5 to 500 Å.

Although the first and second layers 10 and 20 have been described as being interposed between the n-type semiconductor layer 60 and the active layer 30 in this embodiment, they may be formed beneath the n-type semiconductor layer 60 in growing processes thereof.

Accordingly, where the p-type semiconductor 70 is arranged beneath the active layer 30, the first and second layers 10 and 20 may be interposed between the active layer 30 and the p-type semiconductor layer 70.

Also, although the active layer 30 has been described as being made of InGaN in this embodiment, the present invention may be applied to the case in which the active layer 30 is made of GaN, AlGaN, or AlInGaN. The second layer 20 may also be made of InGaN, AlGaN, or AlInGaN, in place of GaN.

Although an example, in which there are three first layers 10 and three second layers 20 (three layer pairs each including one first layer 10 and one second layer 20), has been described in this embodiment, the effects of the present invention can be achieved, as long as there are at least two first layers 10 and at least two second layers 20 (at least two layer pairs).

The alternately-laminated structure of the first and second layers 10 and 20 may be regarded as a part of the active layer 30. That is, the first layers 10 exhibiting a variation in band gap may be regarded as quantum well layers exhibiting a variation in band gap, and the second layers 20 each interposed between the adjacent first layers 10 may be regarded as quantum barrier layers.

Second Embodiment

Figure 5:
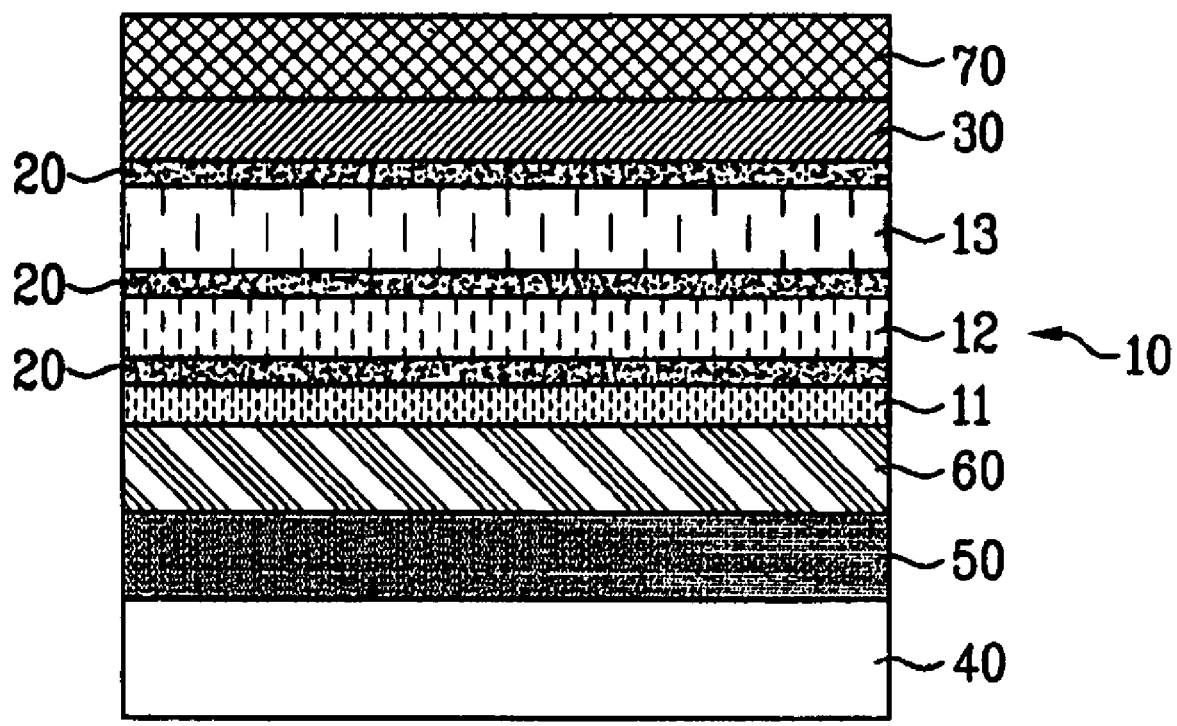
FIG. 5 is a sectional view illustrating a second embodiment of the present invention.

FIG. 5 illustrates a structure according to a second embodiment of the present invention. This structure includes first layers 10 made of the same InGaN material to have the same In content while having different thicknesses. In the illustrated case, the first layers 10 comprise layers 11, 12, and 13. The structure also includes second layers 20 each interposed between adjacent ones of the first layers 10, and made of GaN, and an active layer 30 arranged over the uppermost one of the second layers 20.

The above-described structure may be formed such that the first and second layers 10 and 20 are alternately arranged over an n-type semiconductor layer 60 formed on a substrate 40. An undoped buffer layer 50 may be interposed between the substrate 40 and the n-type semiconductor layer 60.

The active layer 30, which is arranged above the first and second layers 10 and 20, may have a quantum well structure including a quantum well layer and a quantum barrier layer. A p-type semiconductor layer 70 may be formed over the active layer 30.

The first layers 10 have different thicknesses such that an upper one of the first layers 10 has a thickness larger than that of a lower one of the first layers 10. That is, the second InGaN layer 12 has a thickness larger than the thickness of the first InGaN layer 11, and the third InGaN layer 13 has a thickness larger than the thickness of the second InGaN layer 12.

The first layers 10, namely, the layers 11, 12, and 13, have the same In content, so that they have the same band gap energy.

Accordingly, when an InGaN material is grown to form the active layer 30, it is subjected to reduced strain or stress as compared to the case, in which the active layer 30 is grown directly over the n-type semiconductor layer 60, in accordance with the above-described structure. Accordingly, a high-quality InGaN quantum well layer is grown for the active layer 30.

Carriers are captured by the first layers arranged beneath the active layer 30, namely, the three InGaN layers 11, 12, and 13, so that they can be efficiently injected into the InGaN quantum well layer of the active layer 30.

In the above-described structure of the first layers 10 comprising the layers 11, 12, and 13 having different thicknesses, there is a tendency that, when the first layers 10, namely, the InGaN layers, have an increased thickness, the compressive strain of the active layer 30 caused by GaN is reduced. In this case, accordingly, it is possible to achieve an enhancement in the quality of the active layer 30.

The second layers 20 each interposed between the adjacent ones of the InGaN layers 11, 12, and 13 may have a thickness smaller than that of the InGaN layers 11, 12, and 13. Accordingly, the second layers 20 do not interfere with a flow of carriers.

Where the active layer 30 and first layers 10 are made of InGaN, and the first layers 10 has a composition expressed by $In_xGa_{1-x}N$, it is preferred that "x" be 0.1 to 0.15 ($0.1 \leq x \leq 0.15$).

Meanwhile, where the active layer 30 is made of InGaN, the first layers 10 may be made of AlInGaN, as long as the contents of Al and In can be appropriately controlled.

It is preferred that the thickness of the first layers 10 be 50 to 1,000 Å. The thicknesses of the layers 11, 12, and 13 constituting the first layers 10 may vary within the above-described thickness range. It is also preferred that the thickness of the second layers 20 be 5 to 500 Å.

Although the first and second layers 10 and 20 have been described as being interposed between the n-type semiconductor layer 60 and the active layer 30 in this embodiment, they may be formed beneath the n-type semiconductor layer 60 in growing processes thereof.

Accordingly, where the p-type semiconductor 70 is arranged beneath the active layer 30, the first and second layers 10 and 20 may be interposed between the active layer 30 and the p-type semiconductor layer 70.

Also, although the active layer 30 has been described as being made of InGaN in this embodiment, the present invention may be applied to the case in which the active layer 30 is made of GaN, AlGaN, or AlInGaN.

The second layer 20 may also be made of InGaN, AlGaN, or AlInGaN, in place of GaN. Also, the effects of the present invention can be achieved, as long as there are at least two first layers 10 and at least two second layers 20 (at least two layer pairs).

As in the first embodiment, the alternately-laminated structure of the first and second layers 10 and 20 may be regarded as a part of the active layer 30. That is, the first layers 10 exhibiting a variation in band gap may be regarded as quantum well layers exhibiting a variation in thickness, and the second layers 20 each interposed between the adjacent first layers 10 may be regarded as quantum barrier layers.

Third Embodiment

Figure 6:
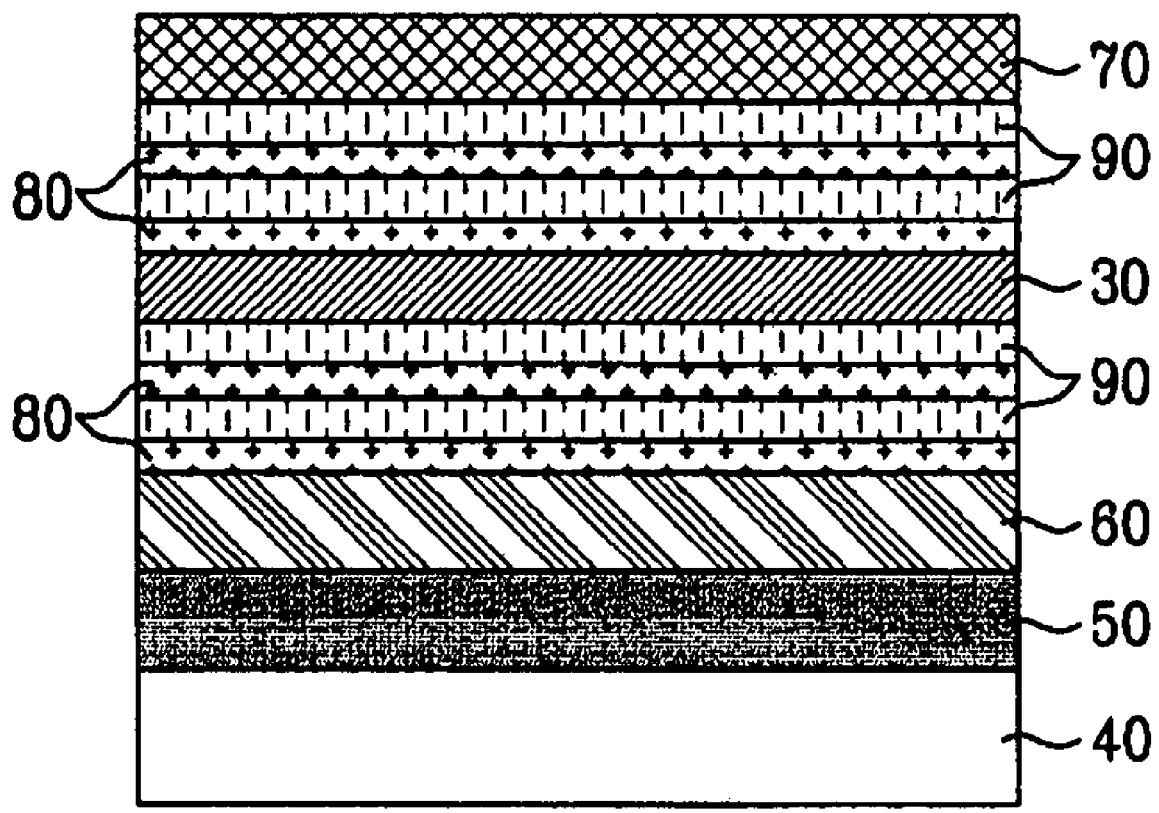
FIG. 6 is a sectional view illustrating a third embodiment of the present invention.

FIG. 6 illustrates a structure according to a third embodiment of the present invention. This structure includes first layers 80 and second layers 90 alternately interposed between an active layer 30 and a p-type semiconductor layer 70.

The above-described structure may be formed such that the first and second layers 80 and 90 are alternately arranged over an n-type semiconductor layer 60 formed on a substrate 40. An undoped buffer layer 50 may be interposed between the substrate 40 and the n-type semiconductor layer 60.

The active layer 30, which is arranged above the first and second layers 80 and 90, may have a quantum well structure including a quantum well layer and a quantum barrier layer. Additional first and second layers 80 and 90 may be alternately formed over the active layer 30. The p-type semiconductor layer 70 is formed over the structure of the additional first and second layers 80 and 90.

Although the first and second layers 80 and 90 have been described as being arranged not only in a region defined between the active layer 30 and the n-type semiconductor layer 60, but also in a region between the active layer 30 and the p-type semiconductor layer 70, in this embodiment, they may be arranged in only one of the regions.

That is, the first and second layers 80 and 90 may be arranged only in a region between the active layer 30 and the n-type semiconductor layer 60 or in a region between the active layer 30 and the p-type semiconductor layer 70.

The first layers 80 may be made of a material exhibiting a band gap higher than that of GaN used to form the n-type semiconductor layer 60 or p-type semiconductor layer 70. For example, the first layers 80 may be made of AlGaN, AlInGaN, etc.

It is preferred that the second layers 90 be made of GaN. Of course, the second layers 90 may be made of InGaN, AlGaN, or AlInGaN, as long as the contents of In and Al can be appropriately controlled.

That is, the first layers 80 may be made of AlGaN or AlInGaN. Where the first layers 80 is made of AlInGaN, and has a composition expressed by $Al_xIn_yGa_{1-x-y}N$, it is preferred that "x" be 0.2 or more ($x \geq 0.2$).

The second layers 90 may be made of GaN, AlGaN, InGaN, AlInGaN, or AlInN. Where the second layers 90 is made of AlInGaN, and has a composition expressed by $Al_xIn_yGa_{1-x-y}N$ it is preferred that "x" be 0.2 or less ($x \leq 0.2$).

Although FIG. 6 illustrates a structure including two first layers 80 and two second layers 90 (two layer pairs), increased numbers of first and second layers 80 and 90 may be formed.

Figure 7:
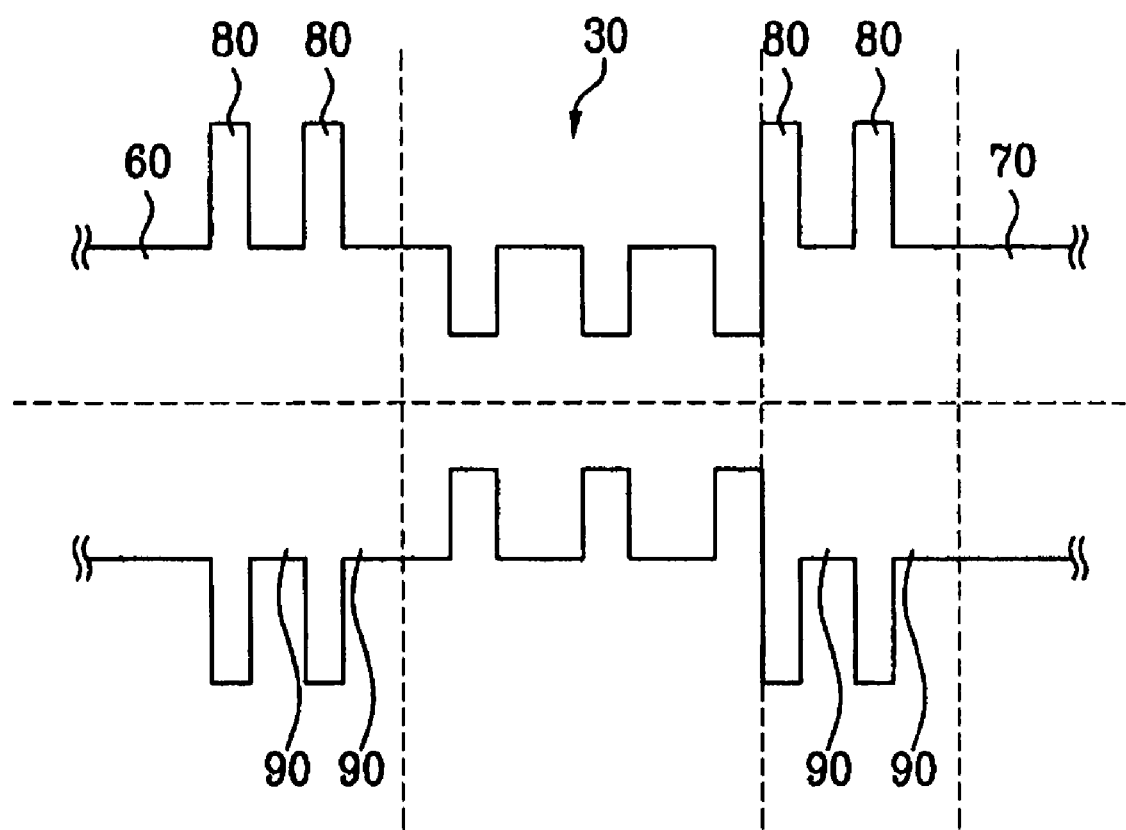
FIG. 7 is an energy band diagram of the case shown in FIG. 6.

FIG. 7 depicts a band diagram of the structure shown in FIG. 6.

Meanwhile, it is possible to use a strained layer supperlattice (SLS) by forming the first layers 80 using AlGaN, and forming the second layers 90 using GaN, in a sequential manner.

In this case, the first and second layers 80 and 90 are doped with a dopant such as Mg, so that they are formed into conductive semiconductor layers. In particular, the conductive semiconductor layers may have p-type semiconductor characteristics.

The doping may be carried out for the overall portion of each of the first and second layers 80 and 90. Alternatively, delta-doping may be carried out for each of the first and second layers 80 and 90, to cause the first and second layers 80 and 90 to have conductivity.

That is, a dopant may be injected once into each of the first and layers 80 and 90 during the growth of the layer 80 or 90 such that the layer 80 or 90 exhibits conductivity at a monolayer thereof. Of course, in this case, there is no reduction in conductivity, as compared to the case in which the overall portion of the layer 80 or 90 is doped.

In accordance with such delta-doping, it is possible to minimize a degradation in thin film quality caused by the injection of a dopant, without causing a reduction in the conductivity of the first and second layers 80 and 90.

Also, the delta-doping is carried out in such a manner that a dopant is injected into a middle portion of each of the first and second layers 80 and 90, a portion of the first or second layer 80 or 90 arranged near the active layer 30, or a portion of the first or second layer 80 or 90 arranged far from the active layer 30, to grow the first or second layer 80 or 90 in the form of a conductive semiconductor.

The materials used to form the quantum well layer and quantum barrier layer constituting the quantum well structure of the active layer, for example, GaN and InGaN or AlGaN, have greatly-different lattice constants. Due to such a lattice constant difference, high strain may be generated. Such strain functions as a factor generating crystal defects such as dislocation.

Furthermore, when strain is locally generated, it obstructs an efficient coupling of electrons and holes for generation of light. For this reason, it is necessary to control generation of strain.

Conventionally, a p-type AlGaN layer is used as an electron blocking layer (EBL) for preventing electrons produced in an n-type semiconductor layer from flowing to a p-type semiconductor layer beyond an active layer, in order to realize a high-power, high-efficiency light emitting device using a GaN-based material.

However, where such p-type AlGaN is used to form a mono-layer, it may rather obstruct the injection of holes into the active layer because the p-type characteristics of AlGaN are inferior, even through the p-type AlGaN layer can perform a desired EBL function.

In accordance with the present invention, such a p-type AlGaN layer is not used. That is, the first and second layers 80 and 90 are alternately laminated in a repeated manner so that they function as an EBL layer while solving problems associated with strain.

Meanwhile, the first layers 80 may have a gradient energy band structure. This can be achieved by linearly varying the amount of source components of the first layers 80, namely, carrying out composition grading for the first layers 80.

FIGS. 8 to 12 depict energy band structures in various cases wherein each first layer 80, for which composition grading has been carried out, forms an SLS, together with the second layer 90.

Figure 8:
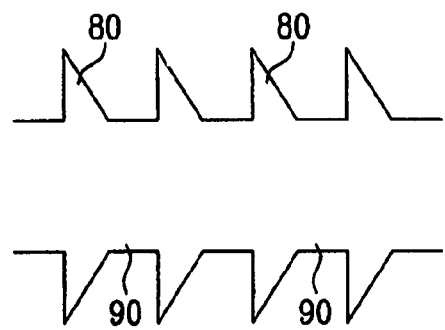
FIG. 8 is an energy band diagram in a first example of first and second layers in the third embodiment of the present invention.
Figure 9:
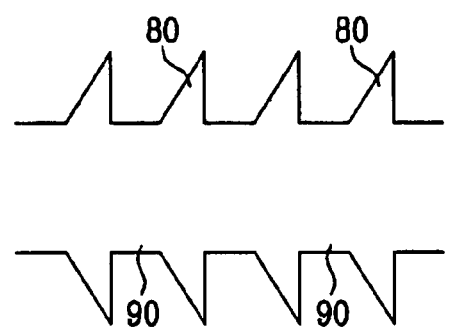
FIG. 9 is an energy band diagram in a second example of first and second layers in the third embodiment of the present invention.

FIG. 8 or 9 correspond to the case wherein the content of an element exhibiting a high energy band ("Al" in, for example, AlGaN) is linearly varied such that the energy band structure of each first layer 80 has a saw-tooth-shaped grading.

Where the material exhibiting a high energy band in the composition of each first layer is a ternary material (based on AlGaN) or a quarternary material (based on AlInGaN), which contains Al and/or In, it is possible to grow the structure of FIG. 8 or 9 by gradually reducing the amount of a reactable Al source, and thus reducing the content of an Al component.

Alternatively, it may also possible to grow a composition-grading SLS having an energy band structure shown in FIG. 8 by growing each first layer while gradually increasing the amount of an In source or reducing the growing temperature, and thus, increasing the content of an In component.

The SLS, which has an energy band structure shown in FIG. 9, can be grown reversely to the growth of the SLS in the case of FIG. 8.

It is also possible to grow the SLS, which has the energy band structure of FIG. 8 or 9, by varying the amounts of Al and/or In and the growing temperature.

The growth of such an SLS can be achieved such that different energy band structures are formed at opposite sides of the active layer 30. For example, it is possible to form the energy band structure of FIG. 8 at one side of the active layer 30 while forming the energy band structure of FIG. 9 at the other side of the active layer 30.

In detail, for example, an SLS structure, which has the energy band structure of FIG. 9, may be interposed between the active layer 30 and the n-type semiconductor layer 60, whereas an SLS structure, which has the energy band structure of FIG. 8, may be interposed between the active layer 30 and the p-type semiconductor layer 70.

When symmetrical SLS structures are arranged at opposite sides of the active layer 30, as described above, the first and second layers 80 and 90 do not function as a resistance when electrons are injected, in a region between the active layer 30 and the n-type semiconductor layer 60, while functioning as an EBL in a region between the active layer 30 and the p-type semiconductor layer 60, to enable carriers to be easily confined in the active layer 30.

Figure 10:
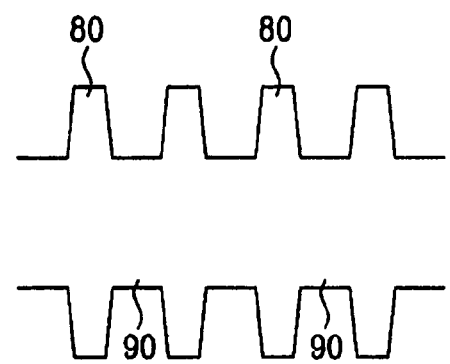
FIG. 10 is an energy band diagram in a third example of first and second layers in the third embodiment of the present invention.
Figure 11:
FIG. 11 is an energy band diagram in a fourth example of first and second layers in the third embodiment of the present invention.
Figure 11:

FIG. 10 or 11 depicts the case wherein each first layer 80 has a trapezoidal or triangular energy band structure.

The growth of such an energy band structure can be achieved using growing methods applied to the cases of FIGS. 8 and 9.

That is, a layer, which has the energy band structure of FIG. 9, is first grown. The state of a component exhibiting a highest energy band in the layer is then maintained for a certain time. Thereafter, a layer, which has the energy band structure of FIG. 8, is grown. As a result, an SLS, in which the material exhibiting a high energy band has an equilateral or unequilateral trapezoidal shape, is grown, as show in FIG. 10.

The structure of FIG. 11 can be formed by omitting, from the growing method for the structure of FIG. 10, the procedure for maintaining the state of the component exhibiting a highest energy band for a certain time.

In this case, it is possible to grow an SLS, in which the material exhibiting a high energy band has triangular shapes exhibiting composition grading at opposite sides thereof.

Figure 12:
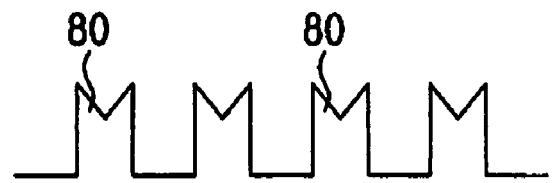
FIG. 12 is an energy band diagram in a fifth example of first and second layers in the third embodiment of the present invention.
Figure 12:

On the other hand, the structure of FIG. 12 can be formed by performing the procedures applied to the case of FIG. 10 in a reverse manner, namely, growing the layer having the energy band structure of FIG. 8, and just then growing the material having the energy band structure of FIG. 9.

The conduction band in the energy band structure of FIG. 12 has an M-shape.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A nitride-based light emitting device comprising:
a first-conductivity semiconductor layer;
a second-conductivity semiconductor layer;
an active layer arranged between the first-conductivity semiconductor layer and the second-conductivity semiconductor layer, the active layer comprising a quantum well layer and a quantum barrier layer; and
an inter-layer arranged between the first-conductivity semiconductor layer and the active layer, the inter-layer comprising a plurality of first layers and second layers which are alternately arranged,
wherein the energy band gap of each first layer of the plurality of first layers ranges between the energy band gap of the first-conductivity semiconductor layer and the energy band gap of the quantum well layer, wherein the first-conductivity semiconductor layer comprises an n-type layer, wherein each first layer has substantially the same thickness, and has a thickness in the range of 50 to 1000 Å, wherein each second layer of the plurality of second layers has substantially the same thickness, wherein the energy band gap of each second layer is substantially the same as that of the first-conductivity semiconductor layer or the second-conductivity semiconductor layer, wherein the inter-layer contacts the active layer, and wherein the inter-layer is configured to reduce strain on the active layer.

2. The nitride-based light emitting device according to claim 1, wherein each first layer comprises one of InGaN or AlInGaN.

3. The nitride-based light emitting device according to claim 2, wherein, when each first layer comprises InGaN, each first layer has a composition expressed by $In_xGa_{1-x}N$, "x" is 0.1 to 0.15 ($0.1 \leq x \leq 0.15$).

4. The nitride-based light emitting device according to claim 1, wherein each second layer comprises GaN.

5. The nitride-based light emitting device according to claim 1, wherein each second layer has a thickness smaller than the thickness of each first layer or the thickness of the quantum barrier layer.

6. The nitride-based light emitting device according to claim 1, wherein the inter-layer is grown earlier than the active layer.

7. The nitride-based light emitting device according to claim 1, wherein each second layer has a thickness in the range of 5 to 500 Å.

8. The nitride-based light emitting device according to claim 1, wherein the plurality of the first and the second layers are arranged in at least two pairs.

9. The nitride-based light emitting device according to claim 1, wherein the energy band gap of the plurality of first layers decreases as each first layer is nearer to the active layer.

10. The nitride-based light emitting device according to claim 1, wherein the quantum well layer and each first layer comprise indium, and wherein the indium composition of the quantum well layer is greater than the indium composition of each first layer.

11. The nitride-based light emitting device according to claim 1, further comprising a substrate on the first-conductivity semiconductor layer.

12. The nitride-based light emitting device according to claim 11, further comprising a buffer layer between the substrate and the first-conductivity semiconductor layer.

13. The nitride-based light emitting device according to claim 1, wherein the inter-layer is configured to enhance carrier confinement characteristics in the active layer.

14. The nitride-based light emitting device according to claim 1, wherein the inter-layer contacts the quantum well layer of the active layer.

15. The nitride-based light emitting device according to claim 1, wherein the second layer of the inter-layer contacts the quantum well layer of the active layer.

16. The nitride-based light emitting device according to claim 1, wherein the inter-layer is arranged between the n-type layer and the active layer.

17. The nitride-based light emitting device according to claim 1, wherein the inter-layer is configured to enhance the quality of the quantum well layer.

18. The nitride-based light emitting device according to claim 1, wherein the energy band gap of one of the first layers is different from those of the other first layers.

19. The nitride-based light emitting device according to claim 1, wherein each of the plurality of second layers has substantially the same energy band gap.

20. The nitride-based light emitting device according to claim 1, wherein each second layer has a thickness in the range of more than 100 Å to 500 Å.

* * * * *